US012685137B2

(12) United States Patent
van der Straten et al.

(10) Patent No.: US 12,685,137 B2
(45) Date of Patent: Jul. 14, 2026

(54) WIRE STRUCTURE FOR LOW RESISTANCE INTERCONNECTS

(71) Applicant: International Business Machines Corporation, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 663 days.

(21) Appl. No.: 18/073,119

(22) Filed: Dec. 1, 2022

(65) Prior Publication Data

US 2024/0186242 A1 Jun. 6, 2024

(51) Int. Cl.
*H10W 20/41* (2026.01)
*H10W 20/00* (2026.01)
*H10W 20/47* (2026.01)

(52) U.S. Cl.
CPC ....... *H10W 20/435* (2026.01); *H10W 20/033* (2026.01); *H10W 20/039* (2026.01); *H10W 20/056* (2026.01); *H10W 20/063* (2026.01); *H10W 20/425* (2026.01); *H10W 20/47* (2026.01)

(58) Field of Classification Search
CPC ........................ H01L 23/5283; H10W 20/435
See application file for complete search history.

(56) References Cited

U.S. PATENT DOCUMENTS

| | | | |
|---|---|---|---|
| 7,713,866 B2 * | 5/2010 | Moon | H01L 23/53295 |
| | | | 438/643 |
| 9,418,889 B2 | 8/2016 | Mountsier et al. | |
| 9,613,853 B2 | 4/2017 | Chen et al. | |
| 11,114,395 B2 | 9/2021 | Lin et al. | |
| 11,955,380 B2 * | 4/2024 | Tsai | H01L 23/5226 |
| 12,278,183 B2 * | 4/2025 | Huang | H01L 23/53295 |
| 2021/0351079 A1 | 11/2021 | Su et al. | |
| 2021/0391421 A1 | 12/2021 | Chu et al. | |
| 2022/0139833 A1 | 5/2022 | Chen et al. | |
| 2022/0165856 A1 | 5/2022 | Yu et al. | |
| 2022/0199521 A1 * | 6/2022 | Lanzillo | H01L 21/76885 |
| 2022/0223473 A1 | 7/2022 | Anderson et al. | |
| 2022/0285510 A1 | 9/2022 | Chen et al. | |
| 2022/0415791 A1 * | 12/2022 | Guler | H01L 21/76877 |
| 2023/0387022 A1 * | 11/2023 | Tien | H10W 20/087 |

* cited by examiner

*Primary Examiner* — Daniel Luke
(74) *Attorney, Agent, or Firm* — Yuanmin Cai

(57) ABSTRACT

Interconnect wire structures and techniques for fabrication thereof with uniform line profile and height are provided. In one aspect, a structure is provided that includes: a wafer; a first interlayer dielectric disposed on the wafer; a second interlayer dielectric disposed on the first interlayer dielectric; and an interconnect wire(s) embedded in the first interlayer dielectric and the second interlayer dielectric, where a first portion of a top half of the interconnect wire(s) has vertical sidewalls, and where a second portion of the top half of the interconnect wire(s) and a bottom half of the interconnect wire(s) have flared sidewalls. A first barrier layer and a (potentially different) second barrier layer can separate the bottom half and top half of the interconnect wire(s) from the first and second interlayer dielectrics. A method for forming the interconnect wire(s) is also provided.

19 Claims, 5 Drawing Sheets

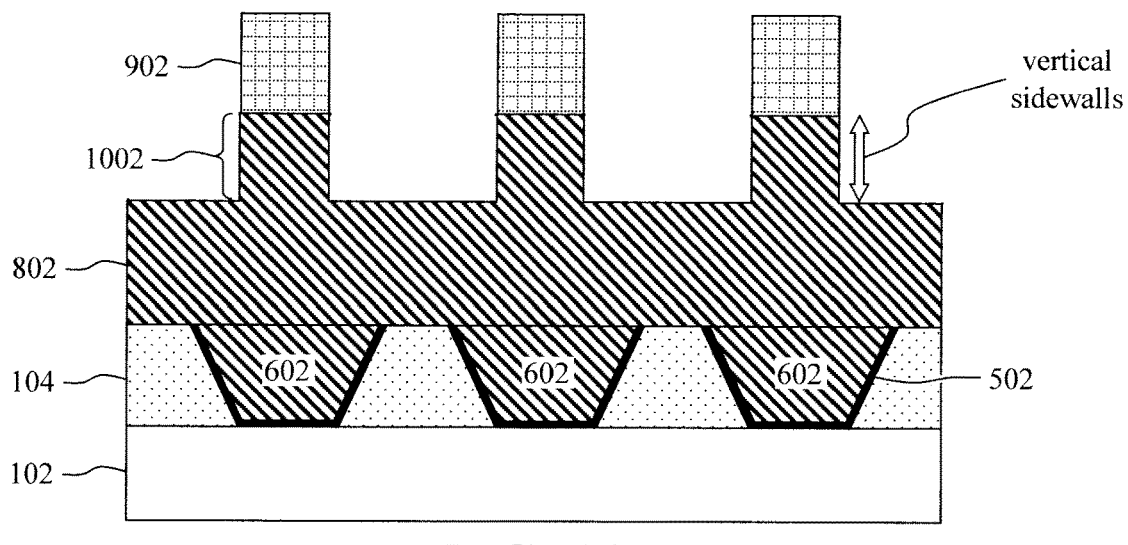
FIG. 10
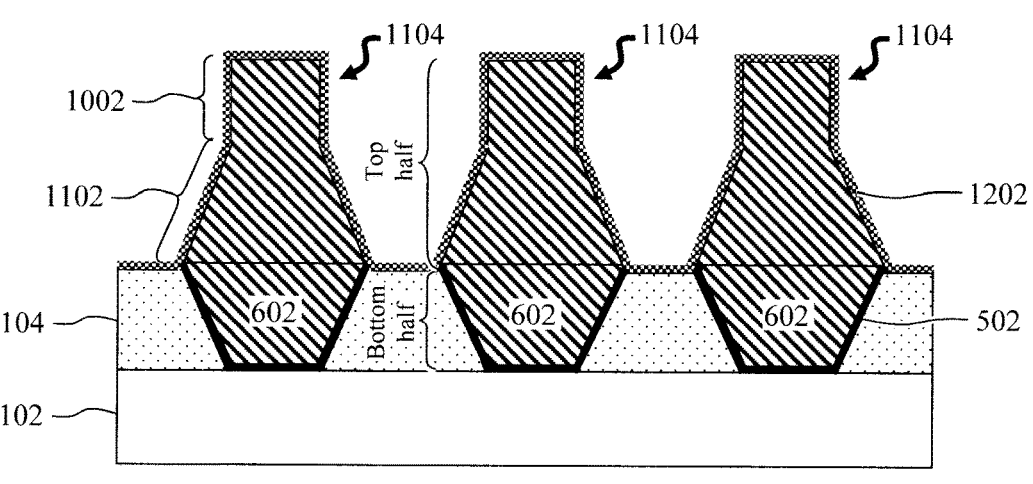
FIG. 11
FIG. 12

WIRE STRUCTURE FOR LOW RESISTANCE INTERCONNECTS

BACKGROUND

The present invention relates to semiconductor device interconnects, and more particularly, to unique interconnect wire structures and techniques for fabrication thereof with uniform line profile and height.

Interconnects in a semiconductor device serve as connections between various components, both horizontally and vertically amongst different levels of the device design. Traditionally, interconnects are formed from conductors such as copper using a so-called damascene or dual-damascene process.

However, with the continued scaling of semiconductor device dimensions, other non-copper metallization options are being explored in order to reduce line resistance. Doing so brings about some notable challenges. One such challenge is dielectric distortion. Namely, the act of depositing an alternate metal such as ruthenium creates stress which can cause the dielectric template to distort, especially with high aspect ratio features. This distortion can undesirably lead to the interconnect structures collapsing against one another, undesirably resulting in non-uniform pitch or, in the worst case, shorts between adjacent interconnects.

Further, distortion of the dielectric template undesirably leads to the formation of interconnect structures having non-uniform dimensions, i.e., non-uniform profile and height. For instance, the distortion of the pattern in the dielectric can cause narrower wires to be formed adjacent to wider wires. The narrower wires often exhibit reduced line height versus wider wires.

Thus, scalable interconnect wire designs that prevent dielectric distortion and have a uniform line profile and height would be desirable.

SUMMARY

The present invention provides interconnect wire structures and techniques for fabrication thereof with uniform line profile and height. In one aspect of the invention, a structure is provided that includes: a wafer; a first interlayer dielectric disposed on the wafer; a second interlayer dielectric disposed on the first interlayer dielectric; and at least one interconnect wire embedded in the first interlayer dielectric and the second interlayer dielectric, where a first portion of a top half of the at least one interconnect wire has vertical sidewalls, and where a second portion of the top half of the at least one interconnect wire and a bottom half of the at least one interconnect wire have flared sidewalls. For instance, the bottom half of the at least one interconnect wire can have a width $W_A$, the first portion of the top half of the at least one interconnect wire can have a width $W_B$, and the second portion of the top half of the at least one interconnect wire can have a width $W_C$, where $W_A > W_B$, and where $W_C > W_B$.

In another aspect of the invention, a structure is provided that includes: a wafer; a first interlayer dielectric disposed on the wafer; a second interlayer dielectric disposed on the first interlayer dielectric; at least one interconnect wire embedded in the first interlayer dielectric and the second interlayer dielectric; a first barrier layer separating the bottom half of the at least one interconnect wire from the first interlayer dielectric; and a second barrier layer separating the top half of the at least one interconnect wire from the second interlayer dielectric, where a first portion of a top half of the at least one interconnect wire has vertical sidewalls, where a second portion of the top half of the at least one interconnect wire and a bottom half of the at least one interconnect wire have flared sidewalls, and where the first barrier layer has a different composition from the second barrier layer. For instance, the first barrier layer and the second barrier layer can each include a different material selected from: tantalum nitride (TaN), hafnium nitride (HfN), tantalum hafnium nitride (TaHfN), and combinations thereof.

In yet another aspect of the invention, a method is provided that includes: depositing a first interlayer dielectric onto a wafer; forming at least one tapered trench in the first interlayer dielectric; depositing a first metal fill material into the at least one tapered trench to form a bottom half of at least one interconnect wire; depositing a second metal fill material onto the first interlayer dielectric over the bottom half of the at least one interconnect wire; patterning the second metal fill material to form a top half of the at least one interconnect wire; and depositing a second interlayer dielectric over the top half of the at least one interconnect wire, where a first portion of a top half of the at least one interconnect wire has vertical sidewalls, and where a second portion of the top half of the at least one interconnect wire and a bottom half of the at least one interconnect wire have flared sidewalls.

A more complete understanding of the present invention, as well as further features and advantages of the present invention, will be obtained by reference to the following detailed description and drawings.

BRIEF DESCRIPTION OF THE DRAWINGS

FIG. 10 is a cross-sectional diagram illustrating a first etch using the second patterned hardmask having been performed to create a first portion of a top half of the interconnect wires in the second metal fill material that has vertical sidewalls according to an embodiment of the present invention;

FIG. 11 is a cross-sectional diagram illustrating a second etch using the second patterned hardmask having been performed to create a second portion of the top half of the interconnect wires in the second metal fill material that has flared sidewalls according to an embodiment of the present invention;

FIG. 12 is a cross-sectional diagram illustrating the second patterned hardmask having been removed, and a (second) barrier layer having been deposited onto the first interlayer dielectric over the top half of the interconnect wires according to an embodiment of the present invention;

DETAILED DESCRIPTION

As provided above, use of alternate non-copper metallization for interconnect wires poses some notable fabrication challenges, among them being dielectric distortion brought about by stress during deposition of metals such as ruthenium. As a result, the pattern in the dielectric becomes distorted in a phenomenon known as line wiggling. Line wiggling is especially prominent with high-aspect ratio structures, and undesirably leads to interconnect wires having non-uniform line profile and height.

Advantageously, provided herein are unique interconnect wire designs and techniques for fabrication thereof that produce interconnect wires of a uniform line profile and height. Namely, as will be described in detail below, the present techniques involve decoupling formation of the bottom half and top half of the interconnect wires, enabling improved metal fill due to low (height to width) aspect ratios with no line wiggling. Here, the term "top half" or "bottom half" refers to "top portion" or "bottom portion" of an object or item that the term refers to. In other word, the word "half" does not necessarily mean "either of two equal parts that compose something". Rather, the word "half" is used to refer either of two parts, which could be equal or non-equal in size, quantity, or any other measures, that together compose or form something such as an object or item. Further, the resulting interconnect wires are locally wider at the bottom which advantageously serves to decrease line resistance. Optionally, the present process can be leveraged to implement different barrier layer and/or different interlayer dielectric materials for the bottom half and top half of the interconnect wires.

Figure 1:
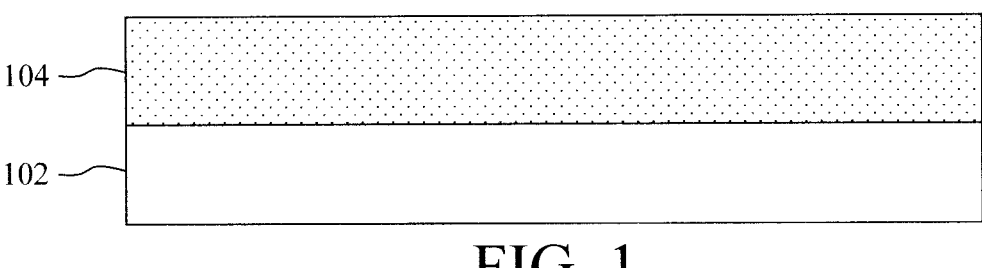
FIG. 1 is a cross-sectional diagram illustrating a (first) interlayer dielectric having been deposited onto a wafer according to an embodiment of the present invention.

An exemplary methodology for forming interconnect wires in accordance with the present techniques is now described by way of reference to FIGS. 1-14. As shown in FIG. 1, the process begins with the deposition of an interlayer dielectric 104 onto a wafer 102. According to an exemplary embodiment, the wafer 102 is a bulk semiconductor wafer, such as a bulk silicon (Si), bulk germanium (Ge), bulk silicon germanium (SiGe) and/or bulk III-V semiconductor wafer. Alternatively, the wafer 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material (s), such as Si, Ge, SiGe and/or a III-V semiconductor. Further, the wafer 102 may already have pre-built structures (not shown) such as transistors, diodes, capacitors, resistors, interconnects, wiring, etc.

Suitable interlayer dielectric 104 materials include, but are not limited to, silicon nitride (SiN), silicon oxycarbide (SiOC), hydrogen-containing silicon oxycarbide (SiCOH), silicon oxycarbonitride (SiCNO) and/or hydrogen-containing silicon oxycarbonitride (SiCHNO) and/or oxide low-$\kappa$ materials such as silicon oxide (SiOx) and/or oxide ultralow-$\kappa$ interlayer dielectric (ULK-ILD) materials, e.g., having a dielectric constant $\kappa$ of less than 2.7, which can be deposited using a process such as chemical vapor deposition (CVD), plasma enhanced chemical vapor deposition (PECVD), atomic layer deposition (ALD), physical vapor deposition (PVD) or a casting process such as spin-coating. Suitable ultralow-$\kappa$ dielectric materials include, but are not limited to, porous organosilicate glass (pSiCOH). Following deposition, the interlayer dielectric 104 can be planarized using a process such as chemical-mechanical polishing.

Figure 2:
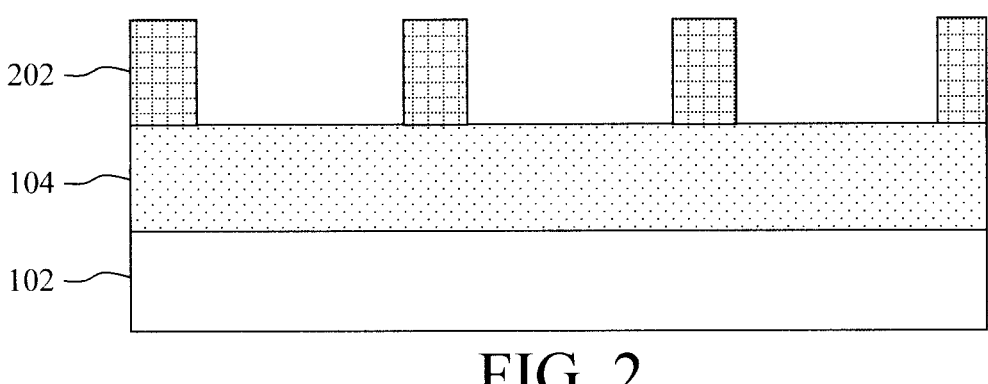
FIG. 2 is a cross-sectional diagram illustrating a (first) patterned hardmask having been formed on the first interlayer dielectric according to an embodiment of the present invention.

As shown in FIG. 2, standard lithography and etching processes are then used to form a patterned hardmask 202 on the interlayer dielectric 104. With standard lithography and etching techniques, a lithographic stack (not shown), e.g., photoresist/anti-reflective coating/organic planarizing layer, is used to pattern the hardmask 202. Suitable hardmask materials include, but are not limited to, silicon nitride (SiN), silicon dioxide (SiO$_2$), titanium nitride (TiN) and/or silicon oxynitride (SiON).

Figure 3:
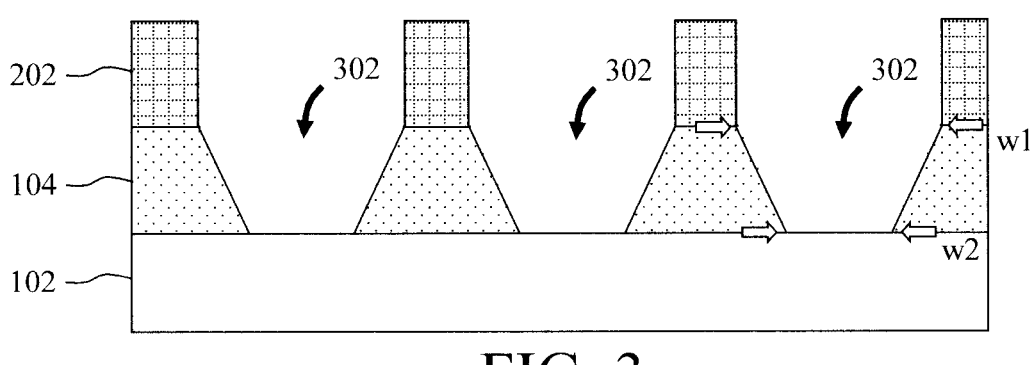
FIG. 3 is a cross-sectional diagram illustrating a tapered etch having been performed using the first patterned hardmask to form tapered trenches in the first interlayer dielectric according to an embodiment of the present invention.

As shown in FIG. 3, a tapered etch is then performed using the patterned hardmask 202 to form tapered trenches 302 in the interlayer dielectric 104. Namely, tapered trenches 302 have inwardly sloping sidewalls going from the top to the bottom of the tapered trenches 302. As a result, the top of each of the tapered trenches 302 has a width w1 and the bottom of each of the tapered trenches 302 has a width w2, where w1 is greater than (>) w2. As will be described in detail below, the bottom half of the interconnect wires will be formed in these tapered trenches 302, which will give the interconnect wires a locally wider bottom. Further, since tapered trenches 302 have a low (height to width) aspect ratio there are no concerns for line wiggling during metal fill.

According to an exemplary embodiment, the tapered etch is performed using an ion beam etching process. Ion beam etching uses a directed beam of charged particles (i.e., ions) to carry out material removal on a substrate. Advantageously, ion beam etching enables a sample to be tilted in order to alter the direction of impact of the ion beam, thereby achieving an angled etch such as that which is used to create the tapered trenches 302.

Figure 4:
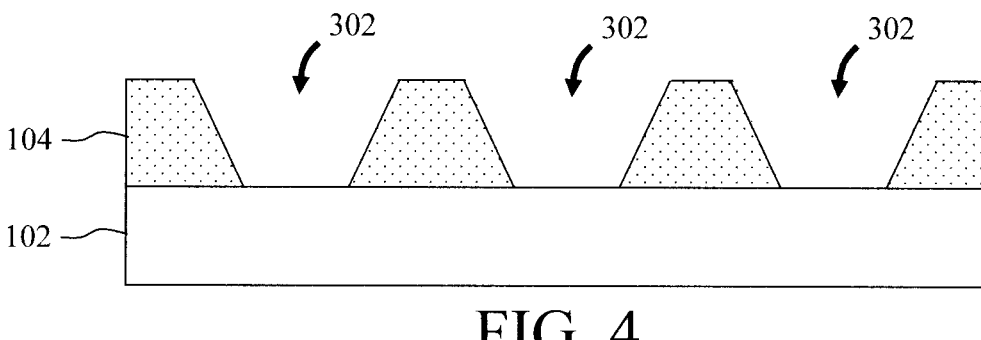
FIG. 4 is a cross-sectional diagram illustrating the first patterned hardmask having been removed according to an embodiment of the present invention.
Figure 5:
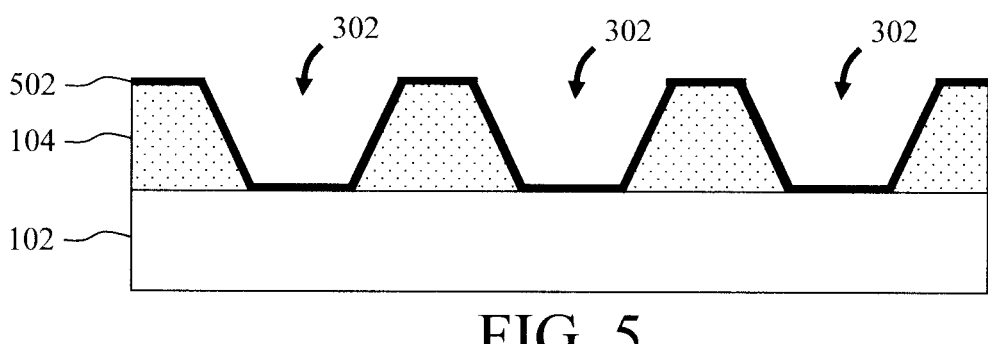
FIG. 5 is a cross-sectional diagram illustrating a (first) barrier layer having been deposited onto the first interlayer dielectric, including within the tapered trenches according to an embodiment of the present invention.

As shown in FIG. 4, what remains of the patterned hardmask 202 is removed following the tapered etch. Removal of the patterned hardmask 202 will enable blanket deposition of a (first) barrier layer. Namely, as shown in FIG. 5, a barrier layer 502 is next deposited onto the interlayer dielectric 104, including within the tapered trenches 302. The as-deposited barrier layer 502 is conformal to the topography of the interlayer dielectric 104 such that the barrier layer 502 fully lines the tapered trenches 302. The barrier layer 502 serves to prevent diffusion of the interconnect metals (see below) into the surrounding interlayer dielectric 104.

Suitable barrier layer 502 materials include, but are not limited to, tantalum nitride (TaN), hafnium nitride (HfN) and/or tantalum hafnium nitride (TaHfN), which can be deposited using a process such as ALD. According to an exemplary embodiment, the barrier layer 502 has a thickness of from about 1 nanometer (nm) to about 3 nm. Based on the present process, barrier layer 502 will be present along the bottom half of the interconnect wires, while another barrier layer will be implemented along the top half. As such, there is an opportunity to vary the barrier layer materials for the bottom half vis-à-vis top half of the interconnects, and embodiments are contemplated herein where barrier layer 502 is formed from a different material than the barrier layer along the top half of the interconnect wires.

Figure 6:
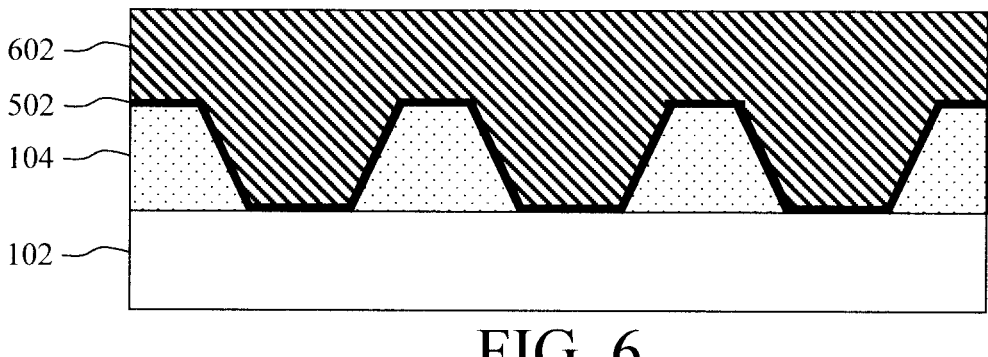
FIG. 6 is a cross-sectional diagram illustrating a (first) metal fill material having been deposited onto the first interlayer dielectric including within the tapered trenches over the first barrier layer according to an embodiment of the present invention.
Figure 7:
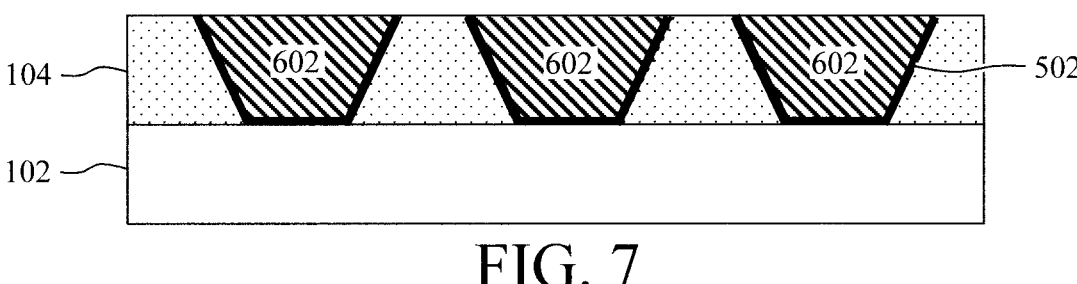
FIG. 7 is a cross-sectional diagram illustrating an overburden of the first metal fill material having been removed to form a bottom half of interconnect wires in the tapered trenches according to an embodiment of the present invention.

As shown in FIG. 6, a metal fill material 602 is then deposited onto the interlayer dielectric 104 including within the tapered trenches 302 over the barrier layer 502. Suitable metal fill materials 602 include, but are not limited to, molybdenum (Mo), rhodium (Rh), ruthenium (Ru), tungsten (W), cobalt (Co) and/or iridium (Ir), which can be deposited using a process such as CVD, ALD, PVD, evaporation, sputtering, or electrochemical plating. Notably, since only the bottom half of the interconnect wires is being formed at this point in the process, the metal fill material 602 is being deposited into tapered trenches 302 which have a low (height to width) aspect ratio. As such, even with the stress encountered during metal deposition, there are no concerns for line wiggling during deposition of the metal fill material 602. Further, filling a low aspect ratio trench like tapered trenches 302 also means that there is no risk of void formation during the metal fill. By comparison, with conventional approaches that involve the deposition of metal into high aspect ratio trenches, the openings of the trenches may become pinched off before the features are fully filled with the metal, resulting in voids (i.e., unfilled spaces). These voids undesirably lead to an increase in wire resistance.

Following deposition of the metal fill material 602, the overburden is removed. See FIG. 7. A process such as chemical mechanical polishing can be used to remove the overburden of metal fill material 602 stopping on the interlayer dielectric 104, which removes the barrier layer 502 from the top surface of the interlayer dielectric 104. As a result, the top surface of the metal fill material 602 is coplanar with the top surface of the interlayer dielectric 104. The metal fill material 602 in the tapered trenches 302 forms the bottom half of the interconnect wires.

Figure 8:
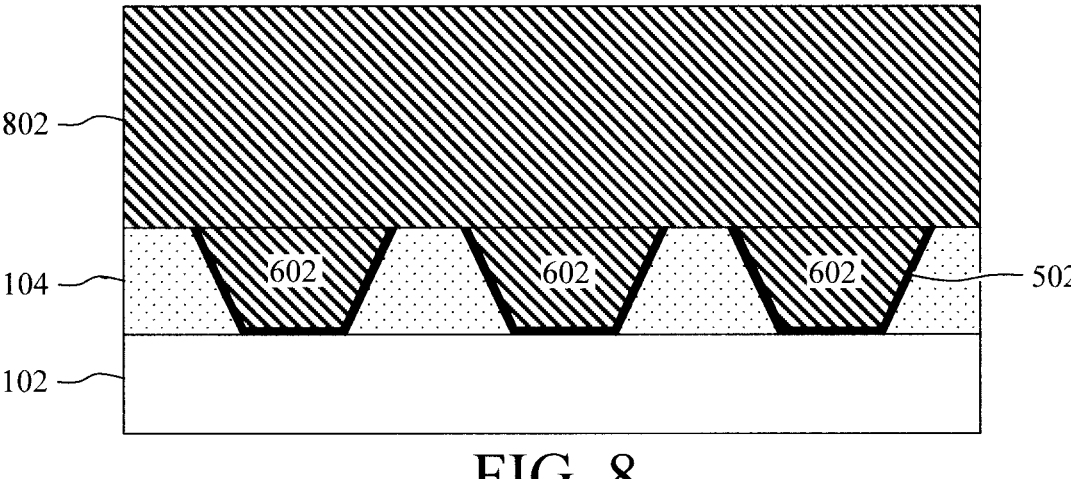
FIG. 8 is a cross-sectional diagram illustrating a blanket layer of a (second) metal fill material having been deposited onto the first interlayer dielectric over, and in direct contact with, the first metal fill material (i.e., the bottom half of the interconnect wires) according to an embodiment of the present invention.

As shown in FIG. 8, a blanket layer of a metal fill material 802 is then deposited onto the interlayer dielectric 104 over, and in direct contact with, the metal fill material 602 that forms the bottom half of the interconnect wires. For clarity, the terms 'first' and 'second' may also be used herein when referring to metal fill material 602 and metal fill material 802, respectively. The metal fill material 802 will serve as the basis for forming the top half of the interconnect wires, directly on the bottom half. As above, suitable metal fill materials 802 include, but are not limited to, Mo, Rh, Ru, W, Co and/or Ir, which can be deposited using a process such as CVD, ALD, PVD, evaporation, sputtering, or electrochemical plating. Since the metal fill material 802 is being deposited as a blanket layer, there are no concerns of void formation (see above). According to an exemplary embodiment, the same material (or same combination of materials)

is used as both the metal fill material 602 and the metal fill material 802. Following deposition, the metal fill material 802 can be planarized using a process such as chemical-mechanical polishing.

Figure 9:
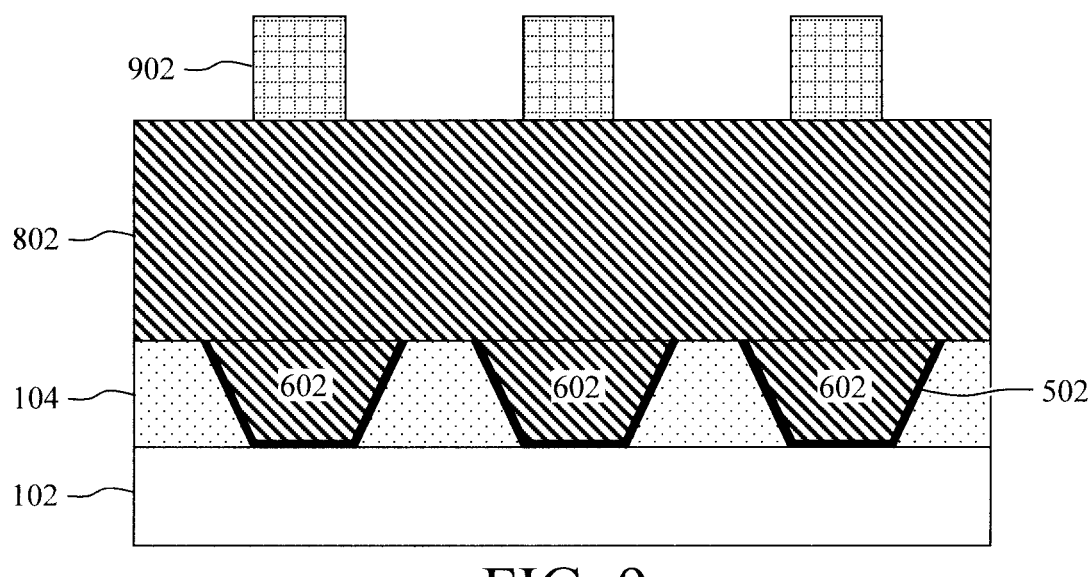
FIG. 9 is a cross-sectional diagram illustrating a (second) patterned hardmask having been formed on the second metal fill material according to an embodiment of the present invention.

As shown in FIG. 9, standard lithography and etching processes (see above) are then used to form a patterned hardmask 902 on the metal fill material 802. For clarity, the terms 'first' and 'second' may also be used herein when referring to patterned hardmask 202 and patterned hardmask 902, respectively. As provided above, suitable hardmask materials include, but are not limited to, SiN, $SiO_2$, TiN and/or SiON.

The patterned hardmask 902 will then be used to form the top half of the interconnect wires in the metal fill material 802 by a subtractive etching process. Namely, as will be described in detail below, this will involve two etch steps in order to create a unique interconnect wire shape having a straight portion with vertical sidewalls over a flared portion that connects the straight portion to the bottom half of the interconnect wires. Namely as shown in FIG. 10, a first etch using the patterned hardmask 902 is performed to create a first portion 1002 of the top half of the interconnect wires in the metal fill material 802 that has straight vertical sidewalls. According to an exemplary embodiment, the etch to form the first portion 1002 is performed using an ion beam etching process. In this case, however, rather than an angled/tapered etch, the etch used to form the top half of the interconnect wires is preferably performed at 90 degrees, i.e., perpendicular to the top surface of the metal fill material 802, such that the first portion 1002 of the top half of the interconnect wires patterned in the metal fill material 802 that has straight vertical sidewalls.

As shown in FIG. 11, a second etch using the patterned hardmask 902 is then performed to create a second portion 1102 of the top half of the interconnect wires in the metal fill material 802 that has flared sidewalls. According to an exemplary embodiment, the etch to form the second portion 1102 is also performed using an ion beam etching process. However, an angled/tapered etch is used instead such that the second portion 1102 of the top half of the interconnect wires patterned in the metal fill material 802 that has flared sidewalls, which meet the flared sidewalls of the bottom half at juncture 1106 of the bottom half and top half of the interconnect wires. The now-formed interconnect wires are given the reference numeral 1104.

As shown in FIG. 12, what remains of the patterned hardmask 902 is removed following the tapered etch, and a barrier layer 1202 is then deposited onto the interlayer dielectric 104 and over the top half of the interconnect wires 1104. For clarity, the terms 'first' and 'second' may also be used herein when referring to barrier layer 502 and barrier layer 1202, respectively. The barrier layer 1202 will serve to prevent diffusion of the metals into the interlayer dielectric that will be deposited over the top half of the interconnect wires 1104 (see below).

Suitable barrier layer 1202 materials include, but are not limited to, TaN, HfN and/or TaHfN, which can be deposited using a process such as ALD. According to an exemplary embodiment, the barrier layer 1202 has a thickness of from about 1 nm to about 3 nm.

In some embodiments, the barrier layer 1202 has the same composition as the barrier layer 502. To look at it another way, the same material (e.g., TaN, HfN and/or TaHfN) is used as both the barrier layer 502 and the barrier layer 1202. This is, however, not a requirement, and embodiments are also contemplated herein where the barrier layer 1202 has a different composition from the barrier layer 502. By way of example only, varying the composition of the barrier layer materials can be advantageous in order to facilitate deposition of another (potentially different) interlayer dielectric over the top half of the interconnect wires 1104 (see below). In that case, different materials can be used for barrier layer 502 vis-à-vis barrier layer 1202. For instance, by way of example only, barrier layer 502 can be formed from one material selected from TaN, HfN and/or TaHfN, while barrier layer 1202 is formed from another, different material selected from TaN, HfN and/or TaHfN.

Figure 13:
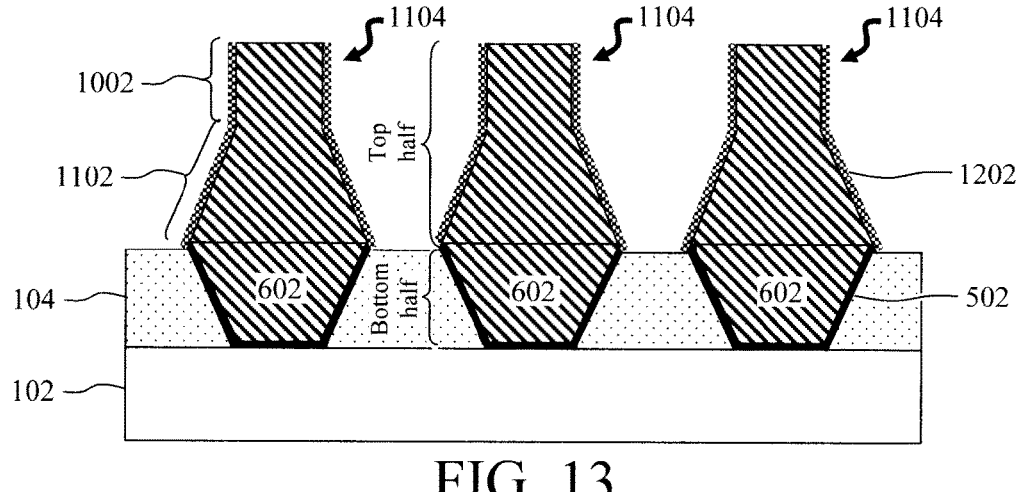
FIG. 13 is a cross-sectional diagram illustrating an etch-back of the second barrier layer having been performed according to an embodiment of the present invention.

As shown in FIG. 13, an etch-back of the barrier layer 1202 is next performed which removes the barrier layer 1202 from horizontal surfaces including from the top surface of the interlayer dielectric 104 and from the top surface of the first portion 1002 of the top half of the interconnect wires 1104. According to an exemplary embodiment, the etch-back of the barrier layer 1202 is performed using a directional (i.e., anisotropic) etching process such as reactive ion etching. As a result, the barrier layer 1202 will remain, as shown in FIG. 13, along the vertical sidewalls of the first portion 1002 of the top half of the interconnect wires 1104 and along the flared sidewalls of the second portion 1102 of the top half of the interconnect wires 1104.

Figure 14:
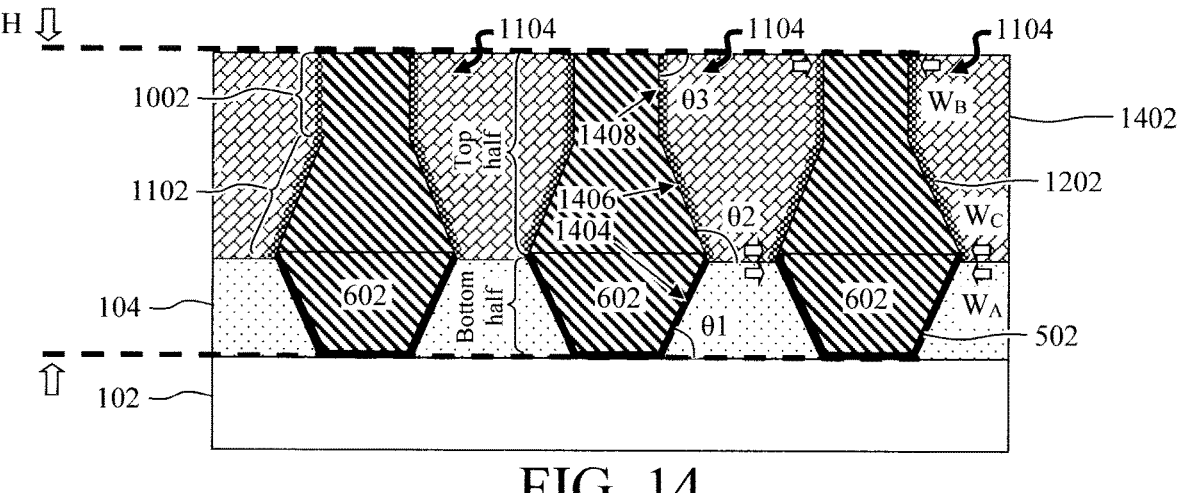
FIG. 14 is a cross-sectional diagram illustrating a (second) interlayer dielectric having been deposited onto the first interlayer dielectric over the second barrier layer and top half of the interconnect wires according to an embodiment of the present invention.

As shown in FIG. 14, an interlayer dielectric 1402 is then deposited onto the interlayer dielectric 104 over the barrier layer 1202 and top half of the interconnect wires 1104. Both selective deposition and non-selective deposition methods of depositing interlayer dielectric 1402 are contemplated herein. The choice of barrier layer 1202 material is especially important for enabling selective deposition of interlayer dielectric 1402. Such selective deposition of interlayer dielectric 1402 may only be feasible on a particular barrier material. For clarity, the terms 'first' and 'second' may also be used herein when referring to the interlayer dielectric 104 and the interlayer dielectric 1402, respectively. Suitable interlayer dielectric 1402 materials include, but are not limited to, SiN, SiOC and/or oxide low-K materials such as SiOx and/or ULK-ILD materials such as pSiCOH, which can be deposited using a process such as CVD, ALD or PVD. Following deposition, in the case of non-selective deposition of interlayer dielectric 1402, the interlayer dielectric 1402 can be planarized using a process such as chemical-mechanical polishing. The bottom half and top half of the interconnect wires 1104 are now embedded in two interlayer dielectrics, i.e., interlayer dielectric 104 and interlayer dielectric 1402, respectively.

Notably, since the top half of the of the interconnect wires 1104 has already been formed by subtractive etching, there is no further metal deposition step that can lead to distortion of the interlayer dielectric 1402. Thus, issues related to line wiggling are avoided altogether. As such, the present interconnect wires 1104 advantageously have a uniform height H and a uniform line profile. By 'uniform line profile' it is meant that each of the present interconnect wires 1104 has the same profile shape including the same bottom half width $W_A$, top half/first portion 1002 width $W_B$, and top half/second portion 1102 width $W_C$, where $W_A > W_B$, and $W_C > W_B$.

In some embodiments, the interlayer dielectric 1402 has the same composition as the interlayer dielectric 104. To look at it another way, the same material (e.g., SiN, SiOC, SiOx and/or pSiCOH) is used as both the interlayer dielectric 104 and the interlayer dielectric 1402. This is, however, not a requirement, and embodiments are also contemplated herein where the interlayer dielectric 1402 has a different composition from the interlayer dielectric 104. By way of example only, varying the composition of the interlayer dielectric materials can be advantageous in order to tailor overall capacitance. In that case, different materials can be used for the interlayer dielectric 104 vis-à-vis the interlayer dielectric 1402. For instance, by way of example only, interlayer dielectric 104 can be formed from one material selected from SiN, SiOC, SiOx and/or pSiCOH, while interlayer dielectric 1402 is formed from another, different material selected from SiN, SiOC, SiOx and/or pSiCOH. In that regard, it may be advantageous to also vary the composition of the barrier layer 502 vis-à-vis barrier layer 1202 as provided above, i.e., in the case of selective deposition of interlayer dielectric 1402.

Further, as shown in FIG. 14, each of the present interconnect wires 1104 has sidewalls with three different orientations. Namely, a sidewall 1404 at the bottom of the interconnect wires 1104 forms an angle θ1 with the top surface of the wafer 102, a sidewall 1406 above the sidewall 1404 forms a different angle θ2 with a top surface of the interlayer dielectric 104, and a sidewall 1408 above the sidewall 1406 forms yet another different angle θ3 with a top surface of the interlayer dielectric 1402. According to an exemplary embodiment, angle θ1 is from about 30 degrees to about 60 degrees, angle θ2 is from about 120 degrees to about 150 degrees, and angle θ3 is about 90 degrees. As a result, the present interconnect wires 1104 have a 'bottle-shaped' design where they are locally wider at the bottom (see widths $W_A$ and $W_C$) advantageously providing a lower resistance, while at the same time eliminating the effects of stress-induced line wiggling as described above. Further, each of the interconnect wires 1104 tapers up to a narrow 'neck' of the bottle-shaped design (see width $W_B$) at the tops of the interconnect wires 1104. Advantageously, tapering the tops of the interconnect wires 1104 provides access for upper metal levels without the risk of shorts between adjacent interconnect wires 1104.

As highlighted above, two (potentially different) interlayer dielectrics, i.e., interlayer dielectric 104 and interlayer dielectric 1402, are used in the formation of the bottom half and top half of the interconnect wires 1104, respectively. Thus, the design of the present interconnect wires 1104 has the barrier layer 502 separating the bottom half of the interconnect wires 1104 from the interlayer dielectric 104, while the (potentially different) barrier layer 1202 separates the top half of the interconnect wires 1104 from the interlayer dielectric 1402. More specifically, as shown in FIG. 14, the barrier layer 502 is present along the flared sidewalls of the bottom half of the interconnect wires 1104, and the barrier layer 1202 is present along the vertical sidewalls of the first portion 1002 of the top half of the interconnect wires 1104 and along the flared sidewalls of the second portion 1102 of the top half of the interconnect wires 1104.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A structure, comprising:
   a wafer;
   a first interlayer dielectric disposed on the wafer;
   a second interlayer dielectric disposed on the first interlayer dielectric; and
   at least one interconnect wire embedded in the first interlayer dielectric and the second interlayer dielectric, wherein a first portion of a top half of the at least one interconnect wire has vertical sidewalls; a second portion of the top half of the at least one interconnect wire and a bottom half of the at least one interconnect wire have flared sidewalls; the first portion and the second portion of the top half of the at least one interconnect wire are both horizontally surrounded by the second interlayer dielectric; and the second interlayer dielectric is a layer of uniform dielectric material, and wherein the bottom half of the at least one interconnect wire has a width $W_A$, the first portion of the top half of the at least one interconnect wire has a width $W_B$, and the second portion of the top half of the at least one interconnect wire has a width $W_C$, wherein $W_A > W_B$, and wherein $W_C > W_B$.

2. The structure of claim 1, wherein the top half of the at least one interconnect wire is disposed directly on the bottom half of the at least one interconnect wire.

3. The structure of claim 1, wherein the bottom half of the at least one interconnect wire is embedded in the first interlayer dielectric, and wherein the top half of the at least one interconnect wire is embedded in the second interlayer dielectric.

4. The structure of claim 3, further comprising:
   a first barrier layer separating the bottom half of the at least one interconnect wire from the first interlayer dielectric; and
   a second barrier layer separating the top half of the at least one interconnect wire from the second interlayer dielectric.

5. The structure of claim 4, wherein the first barrier layer is present along the flared sidewalls of the bottom half of the at least one interconnect wire, and wherein the second barrier layer is present along the flared sidewalls of the top half of the at least one interconnect wire and along the vertical sidewalls of the second portion of the top half of the at least one interconnect wire.

6. The structure of claim 4, wherein the first barrier layer and the second barrier layer each comprises a material selected from the group consisting of: tantalum nitride (TaN), hafnium nitride (HfN), tantalum hafnium nitride (TaHfN), and combinations thereof.

7. The structure of claim 1, wherein the at least one interconnect wire comprises a material selected from the group consisting of: molybdenum (Mo), rhodium (Rh), ruthenium (Ru), tungsten (W), cobalt (Co), iridium (Ir), and combinations thereof.

8. The structure of claim 1, wherein the flared sidewalls of the bottom half of the at least one interconnect wire form an angle $\theta 1$ with a top surface of the wafer of from about 30 degrees to about 60 degrees, and wherein the flared sidewalls of the first portion of the top half of the at least one interconnect wire form an angle $\theta 2$ with a top surface of the first interlayer dielectric of from about 120 degrees to about 150 degrees.

9. The structure of claim 8, wherein the vertical sidewalls of the second portion of the top half of the at least one interconnect wire form an angle $\theta 3$ with a top surface of the second interlayer dielectric of about 90 degrees.

10. A structure, comprising:
   a wafer;
   a first interlayer dielectric disposed on the wafer;
   a second interlayer dielectric disposed on the first interlayer dielectric;
   at least one interconnect wire embedded in the first interlayer dielectric and the second interlayer dielectric;

a first barrier layer separating a bottom half of the at least one interconnect wire from the first interlayer dielectric; and
a second barrier layer separating a top half of the at least one interconnect wire from the second interlayer dielectric, wherein a first portion of the top half of the at least one interconnect wire has vertical sidewalls, wherein a second portion of the top half of the at least one interconnect wire and the bottom half of the at least one interconnect wire have flared sidewalls, and wherein the first barrier layer has a different composition from the second barrier layer,
wherein the first barrier layer is in physical contact with the flared sidewalls of the bottom half of the at least one interconnect wire, and wherein the second barrier layer is in physical contact with the flared sidewalls of the second portion of the top half of the at least one interconnect wire and in physical contact with the vertical sidewalls of the first portion of the top half of the at least one interconnect wire.

11. The structure of claim 10, wherein the top half of the at least one interconnect wire is disposed directly on the bottom half of the at least one interconnect wire.

12. The structure of claim 10, wherein the bottom half of the at least one interconnect wire has a width $W_A$, the first portion of the top half of the at least one interconnect wire has a width $W_B$, and the second portion of the top half of the at least one interconnect wire has a width $W_C$, wherein $W_A > W_B$, and wherein $W_C > W_B$.

13. The structure of claim 10, wherein the first barrier layer and the second barrier layer each comprises a different material selected from the group consisting of: TaN, HfN, TaHfN and combinations thereof.

14. The structure of claim 10, wherein the at least one interconnect wire comprises a material selected from the group consisting of: Mo, Rh, Ru, W, Co, Ir and combinations thereof.

15. The structure of claim 10, wherein the flared sidewalls of the bottom half of the at least one interconnect wire form an angle $\theta 1$ with a top surface of the wafer of from about 30 degrees to about 60 degrees, wherein the flared sidewalls of the first portion of the top half of the at least one interconnect wire form an angle $\theta 2$ with a top surface of the first interlayer dielectric of from about 120 degrees to about 150 degrees, and wherein the vertical sidewalls of the second portion of the top half of the at least one interconnect wire form an angle $\theta 3$ with a top surface of the second interlayer dielectric of about 90 degrees.

16. The structure of claim 10, wherein the first interlayer dielectric has a different composition from the second interlayer dielectric.

17. A structure, comprising:
   a wafer;
   a first interlayer dielectric disposed on the wafer;
   a second interlayer dielectric disposed directly on the first interlayer dielectric;
   an interconnect wire embedded in the first interlayer dielectric and the second interlayer dielectric, wherein a first portion of a top half of the interconnect wire has vertical sidewalls, and wherein a second portion of the top half of the interconnect wire and a bottom half of the interconnect wire have flared sidewalls;
   a first barrier layer directly next to the bottom half of the interconnect wire and in direct contact with the first interlayer dielectric; and
   a second barrier layer directly next to the top half of the interconnect wire and in direct contact with the second interlayer dielectric, the second barrier layer being materially different from the first barrier layer.

18. The structure of claim 17, wherein the first portion and the second portion of the top half of the interconnect wire are both horizontally surrounded by the second interlayer dielectric, the second interlayer dielectric being a layer of uniform dielectric material that is materially different from the first interlayer dielectric.

19. The structure of claim 17, wherein the first barrier layer is in direct physical contact with the bottom half, from a top to a bottom thereof, of the interconnect wire and the second barrier layer is in direct physical contact with the top half, from a top to a bottom thereof, of the interconnect wire.

\* \* \* \* \*